(12) United States Patent
Liu et al.

(10) Patent No.: US 11,404,210 B2
(45) Date of Patent: Aug. 2, 2022

(54) CAPACITOR STACKS FOR NOISE FILTERING IN HIGH-FREQUENCY SWITCHING APPLICATIONS AND AN OPTICAL SUBASSEMBLY MODULE IMPLEMENTING SAME

(71) Applicant: Applied Optoelectronics, Inc., Sugar Land, TX (US)

(72) Inventors: Yi Liu, Houston, TX (US); Qin Li, Houston, TX (US); Hsiu-Che Wang, Rosenberg, TX (US); Ruru Chen, Missouri City, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 223 days.

(21) Appl. No.: 16/598,218

(22) Filed: Oct. 10, 2019

(65) Prior Publication Data
US 2021/0111687 A1 Apr. 15, 2021

(51) Int. Cl.
| | |
|---|---|
| *H01G 4/232* | (2006.01) |
| *H01G 4/30* | (2006.01) |
| *H03H 1/00* | (2006.01) |
| *H03H 3/007* | (2006.01) |
| *H01S 5/02326* | (2021.01) |

(52) U.S. Cl.
CPC ............ *H01G 4/232* (2013.01); *H01G 4/30* (2013.01); *H01S 5/02326* (2021.01); *H03H 1/0007* (2013.01); *H03H 3/0073* (2013.01); *H03H 2001/0014* (2013.01); *H03H 2001/0021* (2013.01)

(58) Field of Classification Search
CPC ................................ H01G 4/232; H01G 4/30
USPC .......................................................... 333/185
See application file for complete search history.

(56) References Cited

U.S. PATENT DOCUMENTS

| | | | | |
|---|---|---|---|---|
| 3,573,675 A | * | 4/1971 | Leonard | H01P 1/20327 333/202 |
| 3,869,677 A | * | 3/1975 | Belohoubek | H01L 23/66 330/286 |
| 6,774,701 B1 | * | 8/2004 | Heston | H03K 17/162 327/408 |

* cited by examiner

*Primary Examiner* — Rakesh B Patel
(74) *Attorney, Agent, or Firm* — Grossman Tucker Perreault & Pfleger, PLLC; Norman S. Kinsella

(57) ABSTRACT

The present disclosure is generally directed to utilizing capacitors stacks with capacitors mounted in a terminal-to-terminal mounting orientation to reduce overall footprint of capacitor arrays for bypass filtering circuits. In an embodiment, each capacitor stack includes at least a first capacitor, a second capacitor, and a ground plane interconnect. The first capacitor includes first and second terminals disposed opposite each other. The first terminal provides a mating surface to couple to the second capacitor, the second terminal couples to a ground plane. The second capacitor includes first and second terminals disposed opposite each other. The first terminal provides a mounting surface to electrically couple to and support the first capacitor, and the second terminal provides a mating surface to electrically and physically couple to the ground plane. Accordingly, the first capacitor can be inverted and mounted atop the second capacitor to eliminate the necessity of wire bonds, for example.

13 Claims, 7 Drawing Sheets

CAPACITOR STACKS FOR NOISE FILTERING IN HIGH-FREQUENCY SWITCHING APPLICATIONS AND AN OPTICAL SUBASSEMBLY MODULE IMPLEMENTING SAME

TECHNICAL FIELD

The present disclosure relates to optical communications, and more particularly, to capacitor stacks having two or more capacitors mounted to each other to reduce overall footprint and simplify electrical interconnection, and bypass/filtering circuitry for decoupling unwanted low and/or high frequencies noises implemented with the same.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceivers generally include one or more transmitter optical subassembly (TOSA) modules for transmitting channel wavelengths. TOSAs modules generally include a laser diode, monitor photodiode (MPD), and laser diode drivers (LDDs). Driving TOSA modules includes high frequency switching. High frequency switching can introduce frequency noise and potentially degrade TOSA performance. Filtering circuits, also known as decoupling or bypass circuits, can include one or more capacitors in an array to filter high and/or low frequency noises on, for instance, DC bias voltages supplied to each TOSA module. Such noise on DC bias has a particularly negatively impact the performance of a TOSA module.

Filtering capacitors of different capacitances and package sizes can be arrayed to perform desired filtering. However, substrates/submounts of TOSA modules generally have limited surface area for mounting and trace routing of components. Such space constraints significantly complicate introducing filtering arrangements/circuitry into TOSA modules, and other optical subassemblies such as receiver optical subassemblies. Continued development of optical subassemblies for transmission speeds of up to 400 Gb/s, and beyond, depends at least in part on filtering circuitry that be implemented using a fraction of surface area of existing approaches.

BRIEF DESCRIPTION OF THE DRAWINGS

These and other features and advantages will be better understood by reading the following detailed description, taken together with the drawings wherein.

DETAILED DESCRIPTION

Figure 1:
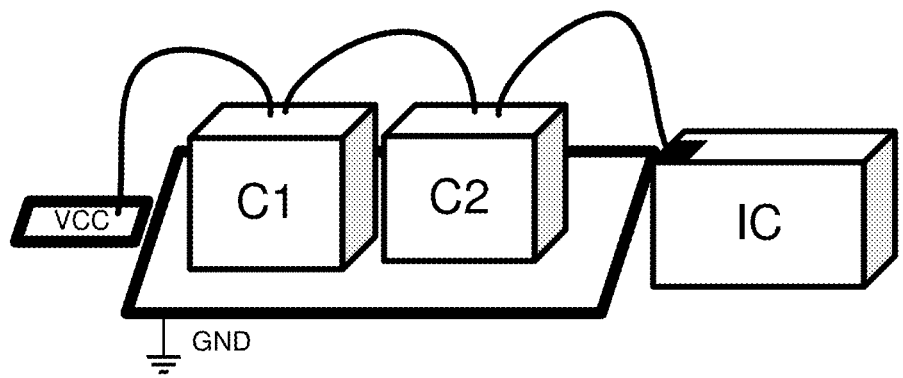
FIG. 1 shows an block diagram of an example filter arrangement having horizontally-mounted filter capacitors.
Figure 3:
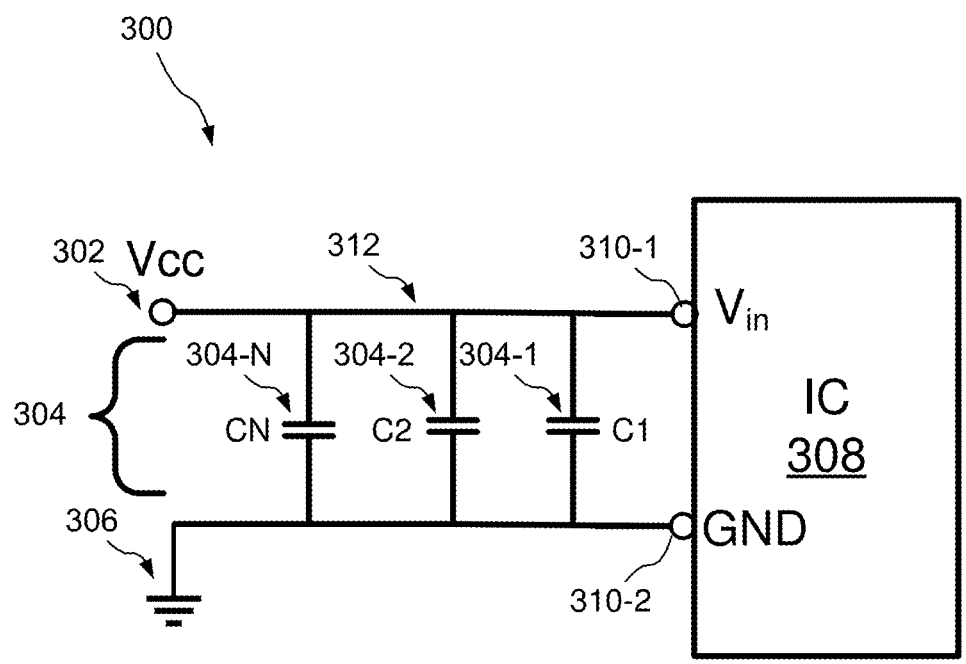
FIG. 3 shows an example bypass circuit configured in accordance with an embodiment of the present disclosure.

Existing filtering arrangements, also known as bypass or decoupling circuits, utilize an array of capacitors to bypass/decouple unwanted frequency noise. FIG. 1 shows an example filter arrangement including a plurality of capacitors coupled in parallel with each other. The filter arrangement can implement a bypass circuit as shown in FIG. 3, for instance. As shown, the capacitors include a first terminal electrically coupled to ground, and a second terminal electrically coupled to VCC. An electrode of the integrated circuit (IC) includes at least one terminal coupled to a terminal of C2. Such arrangements are particularly well suited to provide filtering/bypass capabilities, but require a relatively large amount of surface area for mounting. This footprint problem is exacerbated by having a plurality of filtering circuits to provide bypass filtering on multiple ICs, and/or multiple IC electrodes.

Figure 2:
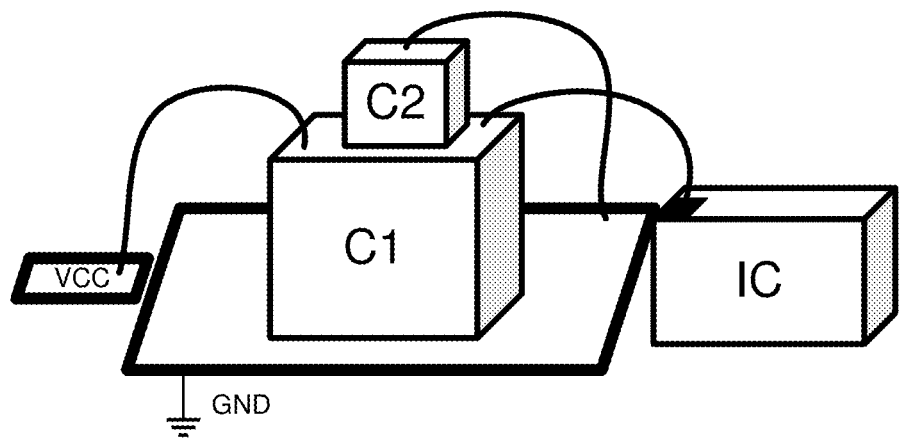
FIG. 2 shows another block diagram of an example filtering arrangement having a vertical capacitor stack, in accordance with an embodiment of the present disclosure.

FIG. 2 shows another approach whereby capacitors are stacked atop each other in a vertical orientation. This vertical stack configuration allows for the capacitors to have a reduced footprint. Wire bonds can electrically couple terminals of the capacitors to VCC, and likewise, couple the electrode of the IC to the capacitors. However, wire bonds increase manufacturing complexity and can introduce time of flight (ToF) and impedance issues. In addition, wire bonds can be easily damaged during manufacturing.

Thus, the present disclosure is generally directed to utilizing capacitors stacks with capacitors mounted in a terminal-to-terminal mounting orientation to reduce overall footprint of capacitor arrays for bypass filtering circuits, referred to herein as simply bypass circuits. In an embodiment, each capacitor stack includes at least a first capacitor, a second capacitor, and a ground plane interconnect. The first capacitor includes first and second terminals disposed opposite each other. The first terminal provides a mating surface to couple to the second capacitor, the second terminal couples to a ground plane. The second capacitor includes first and second terminals disposed opposite each other. The first terminal provides a mounting surface to couple to and support the first capacitor, e.g., in a terminal-to-terminal mounting orientation, and the second terminal provides a mating surface to electrically and physically couple to the ground plane. The ground plane interconnect extends from the ground plane and includes a segment/section that couples to the second terminal of the first capacitor to electrically couple the same with the ground plane. Accordingly, the first capacitor can be inverted and mounted atop the second capacitor, and thus, the first and second capacitors can electrically couple together, e.g., directly, via terminal-to-terminal contact to eliminate the necessity of an electrical interconnect, such as wire bonds.

Figure 4:
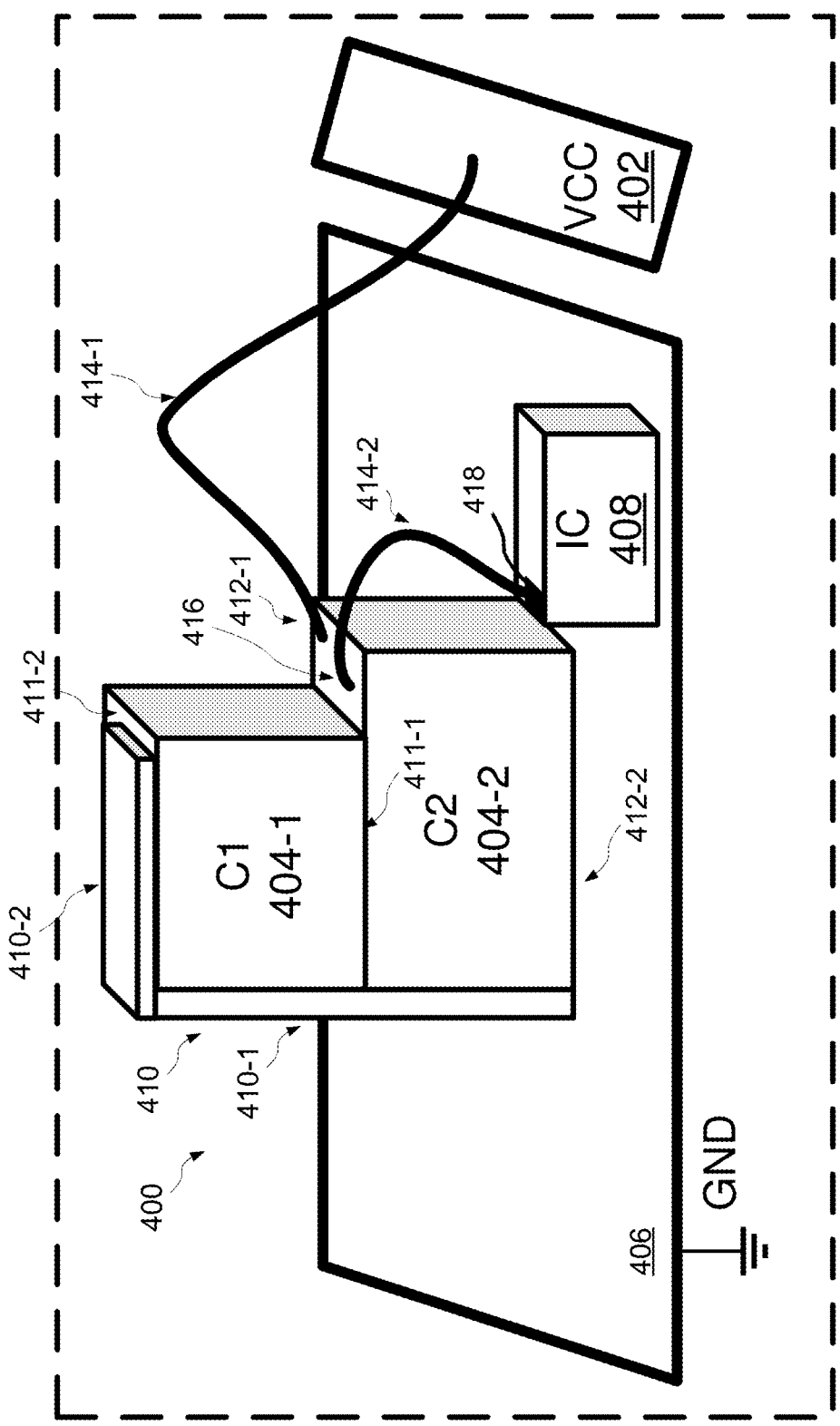
FIG. 4 shows an example capacitor stack arrangement in accordance with an embodiment of the present disclosure.

In an embodiment, the first capacitor includes an overall package size that is less than the second capacitor. When the first capacitor gets mounted to the second capacitor, a step/shoulder gets formed, e.g., based on the dimensional differences between the two (See FIG. 4). This step allows for a single wire bond, or other suitable interconnect, to electrically couple both first and second capacitors to, for instance, a VCC terminal to receive a DC bias voltage.

Accordingly, capacitor stacks consistent with the present disclosure substantially reduce the overall footprint necessary to implement bypass circuitry, or any other circuitry that includes two or more capacitors on space-constrained submounts/substrates. Further, the reduced footprint can allow for a plurality of capacitor stacks to be disposed in close proximity of associated components, such as ICs. Trace layout complexity and the number of wire bonds necessary to implement circuitry using the capacitor stacks can be significantly reduced. In addition, capacitor stacks consistent with the present disclosure can be at least partially assembled separate from optical components and associated circuitry. The assembled, or partially-assembled, capacitor stacks may then be implemented into desired circuitry in a relatively simple manner to allow for, for instance, automated pick-and-place assembly processes.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

FIG. 3 shows an example bypass circuit 300 in accordance with an embodiment. FIG. 3 illustrates the bypass circuit 300 in a highly simplified form for purposes of clarity and not for purposes of limitation. As shown, the bypass circuit 300 includes a VCC terminal 302 (or VCC electrode), an array of capacitors shown collectively as 304 and individually as 304-1, 304-2 and 304-N, an integrated circuit (IC) 308, and a ground plane 306. The bypass circuit 300 may be implemented within, for instance, TOSAs and other optical sub-assemblies. In this scenario, the IC 308 may be implemented as a laser diode driver (LDD) having N number of input electrodes for driving N number of lasers.

The VCC terminal 302 is configured to electrically couple to a power/voltage source to provide power, e.g., DC power, to a power rail 312 which may also be referred to as a DC power rail. Each of the capacitors 304-1 to 304-N couple electrically in parallel with each other and each include a first end coupled to the power rail 312 and a second end coupled to a ground plane 306. The IC 308 includes at least a first terminal/input (e.g., $V_{IN}$) electrically coupled to the DC power rail 312 via a first electrode 310-1 (or terminal 310-1). The IC 308 further includes at least a second terminal/input (e.g., GND) electrically coupled to the ground plane 306 via a second electrode 310-2 (or terminal 310-2).

The VCC terminal 302 may be configured to receive a DC bias voltage from external driver circuitry (not shown). The VCC terminal 302 may then provide voltage via the DC power rail 312 to the IC 308. The array of capacitors 304 are configured to provide a bypass for certain signal components to ensure that the IC 308 receives a relatively stable power signal at a nominal DC level, e.g., 5V.

In the context of high frequency RF switching in TOSA modules, for example, each capacitor of the array of capacitors 304 can be chosen to ensure the array of capacitors 304 filter unwanted frequency noises. TOSA modules generally include components such as a laser diode (LD), arrayed waveguide grating (AWG), and monitor photodiode (MPD). TOSA modules can further include filtering capacitors, e.g., capacitors 304-1 to 304-N, to filter out frequency noise on the direct current (DC) bias. Such noise can manifest as high and/or low-frequency noise which can negatively impact performance of the TOSA module, if left unfiltered.

Accordingly, the array of capacitors 304 can include N number of capacitors in parallel with each other to ensure that such frequency noise gets filtered/decoupled to produce a "clean" DC bias voltage. A capacitor's frequency response is frequency dependent based on Equation 1:

$$Z_c = \frac{1}{j\omega C} \qquad \text{Equation (1)}$$

The particular values for each of the array of capacitors 304 may therefore be chosen to ensure that noise at target frequencies get bypassed/filtered. Low value capacitors tend to bypass/filter high frequency noise, and conversely, relatively high value capacitors tend to bypass/filter lower frequencies. In an embodiment, the array of capacitors 304 includes the first capacitor 304-1 with a first capacitance value and a second capacitor 304-2 with a second capacitance value, the first capacitance value being less than the second capacitance value.

For example, the first capacitor 304-1 can include a first capacitance value of about 100 picofarads (pF) and the second capacitor 304-2 can include an capacitance value between about 100 nanofarads (nF) and 200 nF. Thus, in this example, the second capacitance value may therefore be up to at least 3 orders of magnitude greater than the first capacitance value. In this example, the relatively smaller capacitance of the first capacitor 304-1 can bypass/filter unwanted high frequency noises. Preferably, the first capacitor 304-1 is disposed in close physical proximity with the corresponding input/electrode of the IC 308, such as shown. On the other hand, the relatively large capacitance of the second capacitor 304-2 can bypass/filter unwanted low frequency noises.

As discussed in greater detail below, the array of capacitors 304 can include a stack configuration whereby capacitors mount atop each other in a vertical orientation. The stack configuration advantageously utilizes vertical space, which is to say the area which extends away from a mounting surface of a PCB/submount, rather than horizontal space to reduce overall footprint for the array of capacitors 304. Capacitors in the stacked configuration may generally be referred to herein as simply vertical capacitor stacks, or simply capacitor stacks.

In addition, an embodiment of the present disclosure includes utilizing capacitor package size variances to reduce wiring complexity and achieve nominal bypass/decoupling coverage. As a general rule, inductance of capacitors decreases/increases relative to package size. For instance, as package size increases, inductance generally increases as well, and vice-versa. Accordingly, bypass capacitor arrays generally utilize one or more capacitors with relatively small packages for filtering of high frequency noises, and one or more relatively larger packages for low frequency noises. One layout of such capacitor arrays includes placement of the smaller capacitors proximate the IC for high-frequency noise filtering, and larger capacitors proximate the power source for low-frequency noise filtering. However, design and implementation of capacitor stacks consistent with the present disclosure can include any number of configurations/layouts depending on, for example, layout constraints (e.g., PCB/submount size), target decoupling coverage range(s), and other design-specific characteristics.

With the foregoing in mind, the present disclosure has identified that capacitor stacks configured consistent with the present disclosure can be configured to have a capacitor with a relatively larger package to be used as, in a general sense, a submount or base for mounting and supporting one or more capacitors with a relatively smaller package (which may be referred to herein as "top" capacitors"). For instance, and turning to FIG. 4, the capacitor stack arrangement 400 includes a VCC terminal/electrode 402, first capacitor 404-1, a second capacitor 404-2, a ground plane 406, an IC 408, and a ground plane interconnect 410. The first and second capacitors 404-1, 404-2, may be implemented as surface mount electrolytic capacitors, or as any suitable capacitor package. The IC 408 may be implemented as, for example, a laser diode driver (LDD) capable of driving N number of laser diode (LD) arrangements.

As shown, the second capacitor 404-2 includes a first terminal 412-1 provided by a first surface of the second capacitor 404-2 and a second terminal 412-2 provided by a second surface of the second capacitor 404-2, the first surface being disposed opposite the second surface. The second capacitor 404-2 thus electrically couples to VCC by way of the first terminal 412-1 and electrically couples to the ground plane 406 via the second terminal 412-2. The first terminal 412-1, and in particular the first surface defining the first terminal 412-1, further provides a mounting region for coupling to and supporting at least the first capacitor 404-1.

The first capacitor 404-1 also includes a first terminal 411-1 for electrically coupling to VCC terminal 402 and a second terminal 411-2 for electrically coupling to ground plane 406, the first terminal 411-1 being disposed opposite the second terminal 411-2. The first terminal 411-1 of the first capacitor 404-1 provides a mating surface for coupling to the second capacitor 404-2. Therefore, the first capacitor 404-1 mounts and electrically couples to the first terminal 412-1 of the second capacitor 404-2, e.g., in a terminal-to-terminal orientation, by way of the first terminal 411-1, and specifically, the mating surface defining the first terminal 411-1. Note, the first capacitor 404-1 and the second capacitor 404-2 can electrically couple directly, e.g., as shown, or may utilize a conductive material disposed therebetween such as electrically conductive epoxy.

A ground plane interconnect shown collectively as 410 and individually as first and second electrically conductive segments (or sections) 410-1, 410-2, respectively, extends from the ground plane 406 and is disposed along sidewalls of the first and second capacitors 404-1, 404-2. The ground plane interconnect 410 can be disposed on sidewalls of the vertical capacitor stack, such as shown, or may include a gap/offset therebetween, depending on a desired configuration.

The ground plane interconnect 410 may comprise at least one layer of conductive metallic material such as copper (Cu) or other suitably conductive material. The first electrically conductive segment 410-1 extends from the ground plane 406 to an overall height that is substantially equal to the overall height of the first and second capacitors 404-1, 404-2 stacked atop each other. The first and second electrically conductive segments 410-1, 410-2 may be integrally formed as a single piece of material or may be formed from multiple pieces. The second electrically conductive segment 410-2 extends substantially transverse from the first electrically conductive segment 404-1. The first and second electrically conductive segments 410-1, 410-2 may therefore define an "L" shaped profile.

The second electrically conductive segment 410-2 includes at least a portion disposed on, and electrically coupled with, the second terminal 411-2 of the first capacitor 404-1. Alternatively, the second electrically conductive segment 410-2 may be implemented as other types of electrical interconnect devices, such as a wire bond. In this instance, the second electrically conductive segment 410-2 may be omitted and the first electrically conductive segment 410-1 may electrically couple with the second terminal 411-2 of the first capacitor 404-1 by way of a wire bond(s).

In any event, the first terminal 412-1 of the second capacitor 404-2 provides a common terminal for the capacitor stack based on shoulder/step region 416. The dimensions of shoulder region 416 can vary based on the dimensions of the first and second capacitors 404-1, 404-2, but preferably the shoulder region 416 includes at least 100×100 square microns of space for wire-bonding purposes.

Therefore, a single electrical interconnect such as first wire bond 414-1 can electrically couple both the first terminal 411-1 of the first capacitor 404-1 and the first terminal 412-1 of the second capacitor 404-2 to VCC terminal 402. Likewise, a single electrical interconnect such as a second wire bond 414-2 can electrically couple both the first terminal 411-1 of the first capacitor 404-1 and the first terminal 412-1 of the second capacitor 404-2 to IC 408. In addition, the position of the common terminal provided by shoulder region 416 relative to the IC 408, and more specifically electrode 418, allows for a relatively short electrical interconnect path provided by the second wire bond 414-2. Thus, the first capacitor 404-1 may be electrically coupled to the electrode 418 of the IC 408 in a relatively short and direct manner to ensure nominal decoupling/filter performance for high frequency noises.

Figure 5:
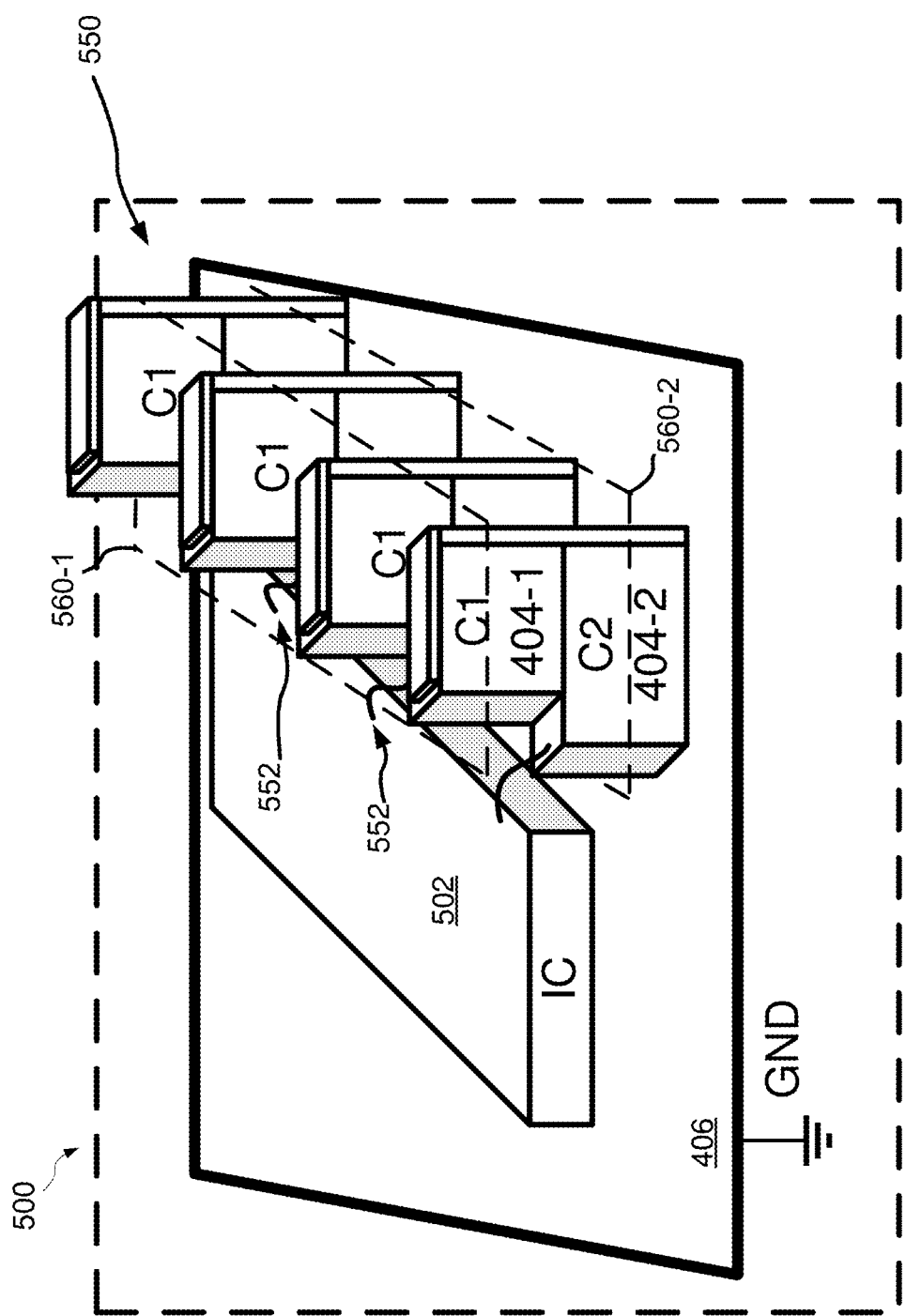
FIG. 5 shows another example capacitor stack arrangement including a plurality of capacitor stacks, in accordance with an embodiment of the present disclosure.

FIG. 5 shows another example capacitor stack arrangement 500 including an array of capacitor stacks 550 consistent with the present disclosure. The capacitor stack arrangement 500 is shown in a highly simplified form for ease of description and clarity. Each of the capacitor stacks of the array of capacitor stacks 550 can be configured substantially similar to the capacitor stack shown and discussed above with reference with FIG. 4, the description of which will not be repeated for brevity.

The capacitor stack arrangement 500 can include one or more associated power rails (not shown) and corresponding VCC terminals. Note that each capacitor stack of the array of capacitor stacks 550 can include N number of capacitors, and not necessarily just two capacitors as shown. In addition, each capacitor stack of the array of capacitor stacks 550 can include capacitors having different capacitor values. For instance, the first capacitor 404-1 may have a different capacitance value, package type, and/or package dimension different from that of the second capacitor 404-2. Each capacitor stack of the array of capacitor stacks 550 may include a substantially similar configuration, e.g., the same configuration of top and bottom capacitor values, or each may include a different configuration depending on a desired application.

Each capacitor stack of the array of capacitor stacks 550 can form an independent bypass circuit, e.g., see FIG. 3. Alternatively, or in addition, two or more capacitor stacks may collectively provide a bypass circuit. Thus, each of the capacitor stacks can be used alone or in combination with other capacitor stacks to provide one or more bypass circuits. Each capacitor stack of the array of capacitor stacks 550 can couple to a corresponding input/electrode of IC via wire bonds, such as, shown. Note, the wire bonds 552 electrically couple to corresponding shelves provided by each capacitor stack of the array of capacitor stacks 550.

In an embodiment, the array of capacitor stacks 550 may thus be utilized to allow for N number of electrodes/inputs of the IC 502 to have filtering to ensure nominal performance, e.g., a clean/stable DC bias voltage. Further, each capacitor stack of the array of capacitor stacks 550 advantageously utilizes vertical stacking, e.g., capacitors stacked on top of each other, rather than mounting each individual capacitor horizontally to the same surface of a PCB/substrate (see FIG. 1) to reduce overall footprint. The resulting reduction in footprint allows for each capacitor stack to be mounted in close proximity to a desired component, e.g., the IC. At least a first common horizontal plane 560-1 may therefore extend through each first capacitor (or top capacitor) C1 of each capacitor stack of the array of capacitor stacks 550, and at least a second common horizontal plane 560-2 extends through each second capacitor (or base capacitor) C2 of each capacitor stack of the array of capacitor stacks 550.

The array of capacitor stacks 550 allows for each individual capacitor stack to be disposed in relatively close proximity with associated electrodes/inputs of the IC 502. In an embodiment, the array of capacitor stacks 550 allows for up to at least 4, 8, or preferably 10 or more electrodes/inputs of IC 502 to electrically couple to an associated capacitor stack of the array of capacitor stacks 550. Further, each capacitor stack of the array of capacitor stacks 550 can couple to the IC via a plurality of substantially equal-length wire bonds 552. By way of contrast, existing approaches that surface mount each capacitor require a relatively large footprint on the submount/PCB to accommodate the capacitors. For space-constrained applications, such as in the context of TOSA circuitry, this significantly complicates TOSA designs and may result in relatively long wire bonds and/or limiting or eliminating filtering capacitors altogether.

Figure 6:
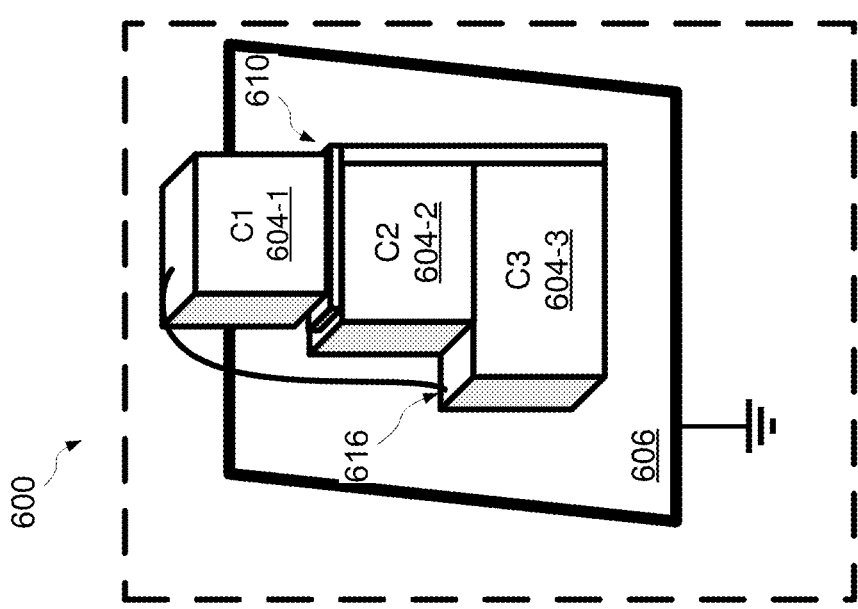
FIG. 6 shows another example capacitor stack consistent with an embodiment of the present disclosure.

FIG. 6 shows another example capacitor stack 600 consistent with an embodiment of the present disclosure. The capacitor stack 600 is shown in a highly simplified form for ease of description and clarity. The capacitor stack 600 may be configured substantially similar to that of the capacitor stack 400 discussed above, the description of which will not be repeated for brevity.

As shown, the capacitor stack 600 includes a first capacitor 604-1, a second capacitor 604-2, a third capacitor 604-3, a ground plane interconnect 610, and a ground plane 606. In the embodiment of FIG. 6, the ground plane interconnect 610 allows for mounting of at least three capacitors. The base/bottom capacitor, e.g., capacitor 604-3, allows for mounting of first and second capacitors 604-1, 604-2, with the ground plane interconnect 610 electrically coupling terminals of both the first and second capacitors 604-1, 604-2, to the ground plane 606. As further shown, the shelf/shoulder 616 provides a common terminal for each of the capacitors. The shelf 616 electrically couples to the first capacitor 604-1 via a wire bond, and to the second capacitor 604-2 by virtue of the terminal-to-terminal mounting of the same, as discussed above. The shelf 616 can further couple to a VCC terminal (not shown) via a wire bond or other suitable interconnect.

Figure 7:
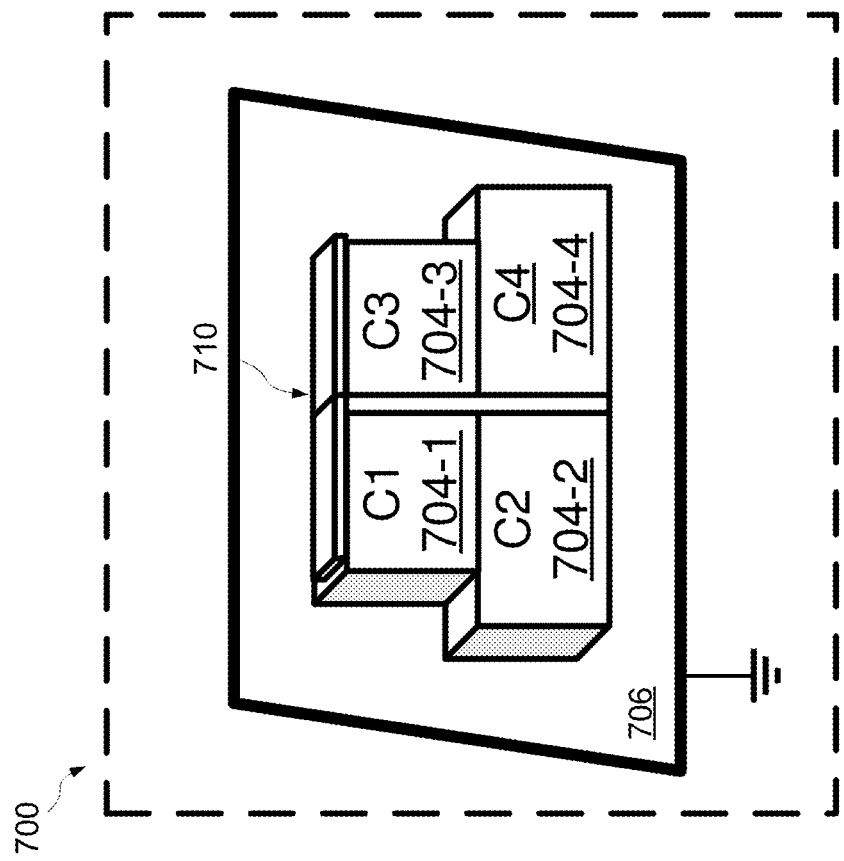
FIG. 7 shows a quad-capacitor stack consistent with an embodiment of the present disclosure.

FIG. 7 shows yet another example capacitor stack 700 consistent with the present disclosure. As shown, the capacitor stack 700 includes a first capacitor 704-1, a second capacitor 704-2, a third capacitor 704-3, a fourth capacitor 704-4, a ground plane 706, and a ground plane interconnect 710. The embodiment of FIG. 7 shows a quad-stack, whereby two capacitor stack pairs are disposed end-to-end and share a common ground plane interconnect 710.

Figure 8:
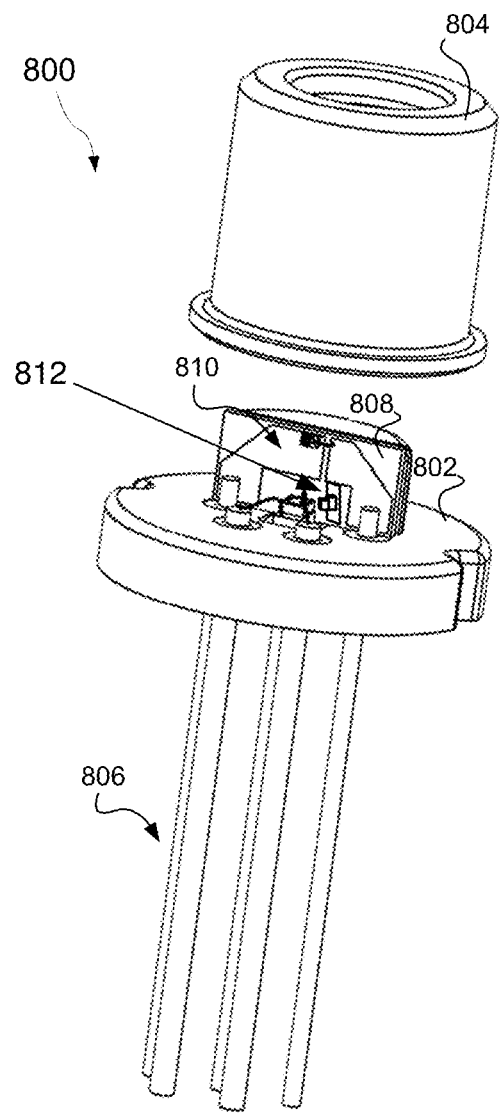
FIG. 8 shows an example TO can laser package having one or more integrated capacitor stacks, in accordance with an embodiment of the present disclosure.

FIG. 8 shows an example embodiment of a TO can laser assembly 800 having one or more capacitor stacks for bypass/filtering, in accordance with an embodiment. As shown, the TO can laser assembly includes a base 802, a cap 804, pins 806, a submount 808, a laser arrangement 810, and at least one capacitor stack 812. The at least one capacitor stack 812 can include two or more capacitors to provide filtering and decouple/bypass unwanted high and/or low frequencies noises from a driving signal, e.g., an RF driving signal, or any other signal used during operation of the TO can laser assembly 800, as variously discussed herein. The resulting filtered driving signal may then be used to modulate a laser diode of the laser arrangement 810.

Capacitors stacks consistent with the present disclosure reduce or otherwise eliminate workarounds, design complexity and performance tradeoffs associated with horizontally-mounted filtering/bypass capacitors. The capacitors stacks reduce distance between capacitors and associated components, e.g., between capacitor(s) for high-frequency noise filtering and electrodes/terminals of an IC, as well as reduce the number of electrical interconnects such as wire bonds. Reducing the number of overall wire bonds, and wire bond length, advantageously reduces manufacturing complexity, minimizes or otherwise avoids adding resistance/impedance (as well as time of flight (TOF) delays), and generally increases yield by having fewer wire bonds which are fragile and easily damaged.

Figure 9:
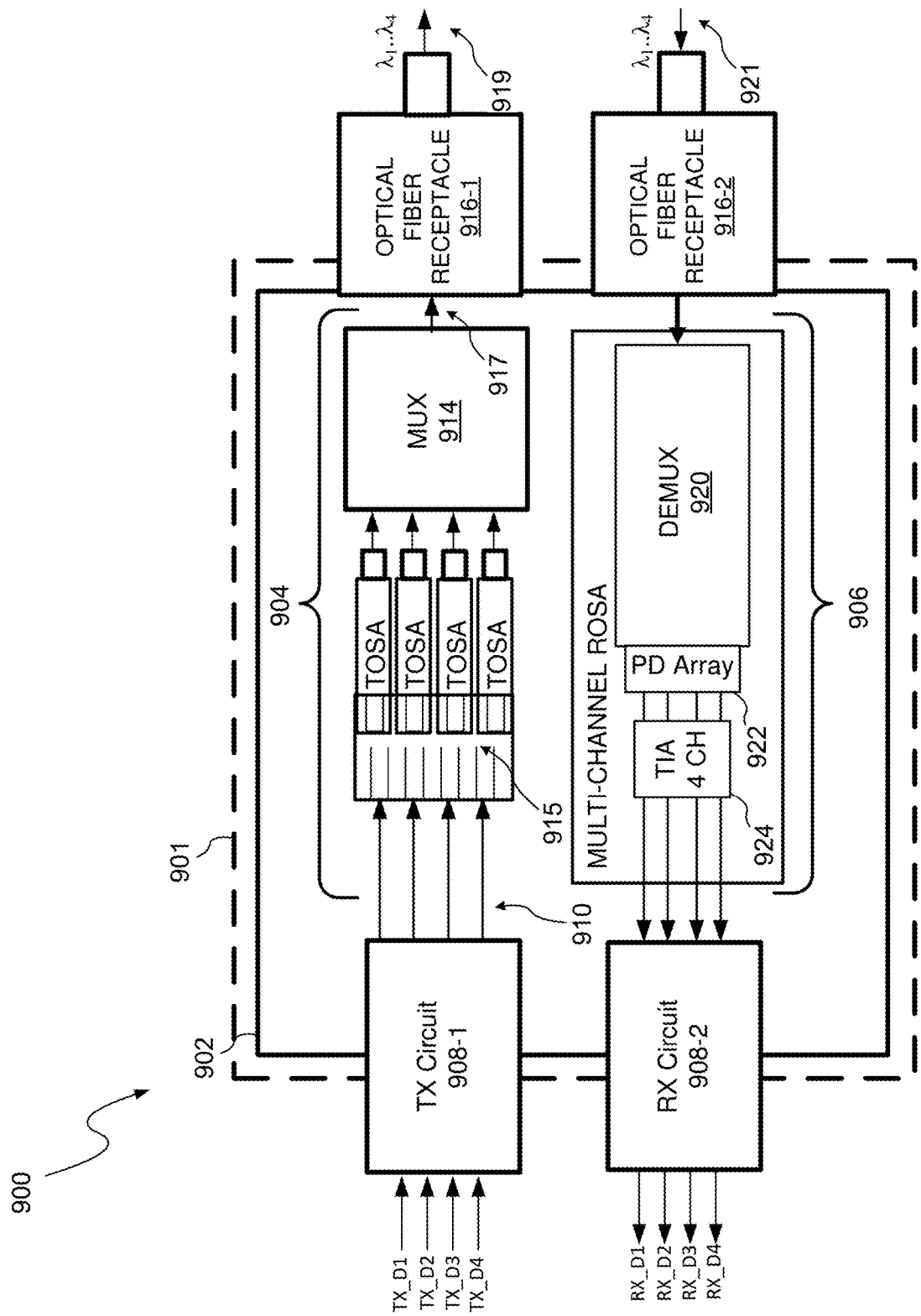
FIG. 9 is a schematic view of an example optical transceiver system consistent with embodiments of the present disclosure.

FIG. 9 shows a block diagram of a multi-channel optical transceiver module 900 consistent with embodiments of the present disclosure. The optical transceiver module 900 includes a housing 901, a substrate 902, a transmitter optical subassembly (TOSA) arrangement 904, a receiver optical subassembly (ROSA) arrangement 906. The housing 901 can comport with various enclosure standards, and preferably with SFF-8661 requirements.

The substrate 902 includes a transmit (TX) connecting circuit 908-1 and a receiver (RX) connecting circuit 908-2. The TX connecting circuit 908-1 and RX connecting circuit 908-2 include a plurality of leads printed/disposed on first end of the substrate 902 and can also include additional circuitry such as power converters, rectifiers, and so on. The first end of the substrate 902 at least partially extends from the housing 901 to allow for external circuitry to electrically couple to the TX connecting circuit 908-1 and RX connecting circuit 908-2.

The substrate 902 further includes TX traces 910 with a first end coupled to the TX connecting circuit 908-1 and a second end electrically coupled to the TOSA arrangement 904. The TOSA arrangement can include hermetically-sealed housing that defines a cavity for receiving and securely holding a plurality of laser arrangements 915. Alternatively, the plurality of laser arrangements may be implemented as a housing to receive and couple to TO can laser assemblies, e.g., TO can laser assemblies of FIG. 8. Each laser arrangement of the plurality of laser arrangements 915 includes passive and/or active components such as a laser diode, monitor photodiode, laser diode driving (LDD) chip, optical isolator, and/or focus lens. In addition, each of the laser arrangements 915 can include one or more capacitor stacks as variously disclosed herein. The one or more capacitor stacks may be used for bypassing/filtering of unwanted high and/or low frequencies noises. To this end, each LDD may include one or more capacitor stacks electrically coupled at one or more inputs/electrodes of the LDD for filtering purposes. In addition, other integrated circuits (ICs) and supporting circuitry of the plurality laser assemblies can utilize capacitor stacks as disclosed herein for filtering or other transceiver operation.

The optical multiplexer 914 includes input ports to receive channel wavelengths from the TOSA arrangement 904 and an output port to output a multiplexed optical signal 917 having each of the received channel wavelengths. The multiplexed optical signal 917 gets launched on an external TX optical fiber by way of optical fiber receptacle 916-1 (which may also be referred to as an optical coupling receptacle). The optical multiplexer 914 comprises an arrayed waveguide grating (AWG), although this disclosure is not intended to be limited in this regard. In addition, the optical multiplexer 914 may not necessarily be included within the housing 901 depending on a desired configuration.

In operation, the TX connecting circuitry 908-1 provides driving signals (D1-D4) to drive the TOSA arrangement 904, e.g., from external driving circuitry. The TOSA arrangement 904 then receives the driving signals (D1-D4), e.g., via TX traces 910, and modulates the plurality of laser arrangements 915 to convert output four different output optical signals ($\lambda_1$-$\lambda_4$). The optical multiplexer 914 then combines the output optical signals into a multiplexed optical signal 917. The multiplexed optical signal 917 then launches on to the transmit optical fiber 919 by way of the optical fiber receptacle 916-1.

The RX connecting circuit 908-2 includes a plurality of traces to electrically couple the multi-channel ROSA arrangement 906 to external receiver circuitry. The multi-channel ROSA arrangement includes optical demultiplexer 920, photodiode (PD) array 922, and transimpedance amplifier 924.

The optical demultiplexer 920 comprises, for example, an arrayed waveguide grating (AWG) or other suitable device. An input of the optical demultiplexer 920 is aligned with the demux plane to receive an RX optical signal having a plurality of channel wavelengths. An output end of the optical demultiplexer 920 outputs separated channel wavelengths on to corresponding photodetectors of the PD array 922. The PD array 922 outputs electrical signals proportional to detected wavelengths. Transimpedance amplifier 924 includes circuitry to amplify and filter signals from the PD array 922.

Thus, in operation an optical signal having a plurality of channel wavelengths ($\lambda_1$ ... $\lambda_4$) is received by the multi-channel ROSA arrangement 906 by way of RX optical fiber 921 and optical fiber receptacle 916-2. The optical demultiplexer 920 is aligned to receive the optical signal and output each separated channel wavelength on to an associated photodiode of the array of PDs 922. The transimpedance amplifier 924 receives the electrical signals from the PD array 922 to provide receive signals (D1-D4). External receiver circuitry receives the receive signals (D1-D4) by way of the traces and RX connecting circuitry 908-2.

In accordance with another aspect of the present disclosure a capacitor stack for use in bypass circuits to decouple unwanted high and/or low frequency noises from a signal is disclosed. The capacitor stack comprising a first capacitor having a first terminal disposed opposite a second terminal, the first terminal providing a mating surface, a second capacitor having a first terminal disposed opposite a second terminal, the first terminal providing a mounting surface for coupling to and supporting the first capacitor via the mating surface of the first capacitor, wherein the first capacitor mounts vertically atop the second capacitor in a terminal-to-terminal orientation, wherein the terminal-to-terminal orientation includes the first terminal of the first capacitor electrically coupling to the first terminal of the second capacitor via the mounting surface, and wherein the mounting surface of the second capacitor provides a shelf region to electrically couple the first and second capacitors to a power terminal and/or electrode of an associated integrated circuit (IC).

In accordance with another aspect of the present disclosure an optical subassembly is disclosed. The optical subassembly comprising a submount for coupling to at least one optical component, the submount defining a ground plane, a voltage source, an integrated circuit (IC), at least one capacitor stack disposed on the submount and electrically coupled to the IC to provide a bypass circuit for a first electrode of the IC, the at least one capacitor stack including at least a first capacitor vertically mounted on a second capacitor, the second capacitor having a first terminal to provide a mounting surface to couple to and support the first capacitor and a second terminal to electrically couple to the ground plane, a common terminal provided by the mounting surface of the second capacitor, the common terminal to electrically couple the first and second capacitors to each other, and a first electrical interconnect electrically coupling the common terminal to the voltage source and a second electrical interconnect electrically coupling the common terminal to the first electrode of the IC.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A capacitor stack for use in bypass circuits to decouple unwanted high and/or low frequency noises from a signal, the capacitor stack comprising:

a first capacitor having a first terminal disposed opposite a second terminal, the first terminal providing a mating surface;

a second capacitor having a first terminal disposed opposite a second terminal, the first terminal providing a mounting surface for coupling to and supporting the first capacitor via the mating surface of the first capacitor;

wherein the first capacitor mounts vertically atop the second capacitor in a terminal-to-terminal orientation, wherein the terminal-to-terminal orientation includes the first terminal of the first capacitor electrically coupling to the first terminal of the second capacitor via the mounting surface;

wherein the mounting surface of the second capacitor provides a shelf region to electrically couple the first and second capacitors to a power terminal and/or electrode of an associated integrated circuit (IC); and a ground plane interconnect, the ground plane interconnect to electrically couple the second terminal of the first capacitor to a ground plane.

2. The capacitor stack of claim 1, wherein the ground plane interconnect includes at least one electrically conductive segment that is disposed along a sidewall of the first and/or second capacitor.

3. The capacitor stack of claim 1, wherein the first capacitor has a first capacitance value and the second capacitor has a second capacitance value, the first and second capacitance value being different.

4. The capacitor stack of claim 3, wherein the first capacitance value is less than the second capacitance value.

5. The capacitor stack of claim 1, wherein the first capacitor has a first package size and the second capacitor has a second package size, wherein the first package size is smaller than the second package size.

6. The capacitor of claim 5, wherein the shelf region is provided at least in part based on the first package size being smaller than the second package size.

7. An optical subassembly, the optical subassembly comprising:

a submount for coupling to at least one optical component, the submount defining a ground plane;

a voltage source;

an integrated circuit (IC);

at least one capacitor stack disposed on the submount and electrically coupled to the IC to provide a bypass circuit for a first electrode of the IC, the at least one capacitor stack including at least a first capacitor vertically mounted on a second capacitor, the second capacitor having a first terminal to provide a mounting surface to couple to and support the first capacitor and a second terminal to electrically couple to the ground plane;

a common terminal provided by the mounting surface of the second capacitor, the common terminal to electrically couple the first and second capacitors to each other; and a first electrical interconnect electrically coupling the common terminal to the voltage source and a second electrical interconnect electrically coupling the common terminal to the first electrode of the IC.

8. The optical subassembly of claim 7 implemented as a multi-channel transmitter optical subassembly (TOSA) module capable of transmitting at least four (4) different channel wavelengths.

9. The optical subassembly of claim 7, further comprising a ground plane interconnect extending from the ground plane to electrically couple a terminal of the first capacitor to the ground plane.

10. The optical subassembly of claim 9, wherein the ground plane interconnect comprises first and second electrically conductive segments, the second electrically conductive segment extending substantially transverse relative to the first electrically conductive segment.

11. The optical subassembly of claim 7, wherein the first and second electrical interconnects comprise first and second wire bonds, respectively.

12. The optical subassembly of claim 7, further comprising a plurality of capacitor stacks, each capacitor stack of the plurality of capacitor stacks to electrically couple to corresponding electrodes of the IC and provide a bypass circuit.

13. The optical subassembly of claim 7, wherein the IC is implemented as a laser diode driver (LDD) capable of driving N number of laser arrangements.

* * * * *